United States Patent [19]
Jiang

[11] Patent Number: 6,137,063
[45] Date of Patent: Oct. 24, 2000

[54] ELECTRICAL INTERCONNECTIONS

[75] Inventor: Tongbi Jiang, Boise, Id.

[73] Assignee: Micron Technology, Inc., Boise, Id.

[21] Appl. No.: 09/145,485

[22] Filed: Sep. 1, 1998

Related U.S. Application Data

[62] Division of application No. 09/032,437, Feb. 27, 1998.

[51] Int. Cl.[7] .............................. H01R 12/04; H05K 1/11
[52] U.S. Cl. ......................... 174/261; 174/259; 174/260;
361/767; 361/773; 361/774; 257/773
[58] Field of Search .................................. 174/257, 259,
174/260, 261, 250; 361/767, 773, 774,
783, 803, 760, 768, 771, 772, 748; 257/737,
773, 777, 778, 782, 783, 786

[56] References Cited

U.S. PATENT DOCUMENTS

| | | | |
|---|---|---|---|
| 3,757,075 | 9/1973 | Munt | 219/121 LM |
| 4,752,027 | 6/1988 | Gschwend | 228/180.2 |
| 4,818,728 | 4/1989 | Rai et al. | 437/209 |
| 4,878,611 | 11/1989 | LoVasco et al. | 228/180.2 |
| 4,914,057 | 4/1990 | Gloton | 437/193 |
| 4,922,321 | 5/1990 | Arai et al. | 357/68 |
| 4,940,181 | 7/1990 | Juskey, Jr. et al. | 228/180.2 |
| 4,970,780 | 11/1990 | Suda et al. | 29/840 |
| 5,019,944 | 5/1991 | Ishii et al. | 361/400 |
| 5,068,714 | 11/1991 | Seipler | 357/80 |
| 5,128,746 | 7/1992 | Pennisi et al. | 357/72 |
| 5,130,779 | 7/1992 | Agarwala et al. | 357/67 |
| 5,258,577 | 11/1993 | Clements | 174/88 R |
| 5,426,266 | 6/1995 | Brown et al. | 174/267 |
| 5,505,367 | 4/1996 | Degani et al. | 228/248.1 |
| 5,517,752 | 5/1996 | Sakata et al. | 29/832 |
| 5,545,589 | 8/1996 | Tomura et al. | 437/183 |
| 5,611,140 | 3/1997 | Kulesza et al. | 29/832 |
| 5,767,580 | 6/1998 | Rostoker | 257/737 |
| 5,804,882 | 9/1998 | Tsukagoshi et al. | 257/783 |
| 5,808,878 | 9/1998 | Saito et al. | 361/818 |
| 5,886,415 | 3/1999 | Akagawa | 257/789 |
| 5,926,694 | 7/1999 | Chigawa et al. | 438/106 |

FOREIGN PATENT DOCUMENTS

| | | |
|---|---|---|
| 57-176738 | 10/1982 | Japan . |
| 64-8647 | 1/1989 | Japan . |
| 1-120039 | 5/1989 | Japan . |

OTHER PUBLICATIONS

Assembly with Conductive Adhesives, K. Gilleo, Solder and Surface Mount Technology, No. 19, p. 12, Aug./Sep., 1994.
An Approach to the Anisotropic Conductive Adhesives for Micro–Interconnection Technology, Takao Komukai, Misuaki Miyazaki and Yuki Samejima, vol. 1, pp. 402–407, Sep. 10–12, 1996.
A New Anisotropic Conductive Film with Arrayed Conductive Particles, Kazuo Ishibashi and Jun Kimura, vol. 19, No. 4, pp. 752–757, Nov. 1996.
Bond ICs to PCBs Without Overkill or Underfill and ACP Types/Applications, Toshiba Chemical America, Inc., Advanced Packaging, Mar. 1997.

*Primary Examiner*—Jeffrey Gaffin
*Assistant Examiner*—Jeremy Norris
*Attorney, Agent, or Firm*—Well, St. John, Roberts, Gregory & Matkin, P.S.

[57] ABSTRACT

The present invention includes electrical interconnections, methods of conducting electricity, and methods of reducing horizontal conductivity within an anisotropic conductive adhesive. In one embodiment, an electrical interconnection configured to electrically couple a first substrate and a second substrate includes: a bond pad of the first substrate having a male configuration; and a bond pad of the second substrate having a female configuration, the bond pad of the second substrate being configured to mate with the bond pad of the first substrate during electrical connection of the bond pads of the first substrate and the second substrate. A method of conducting electricity according to the present invention includes providing first and second bond pads individually defining a planar dimension; coupling the first and second bond pads at an interface having a surface area greater than the area of the planar dimension; and conducting electricity between the first and second bond pads following the coupling.

26 Claims, 5 Drawing Sheets

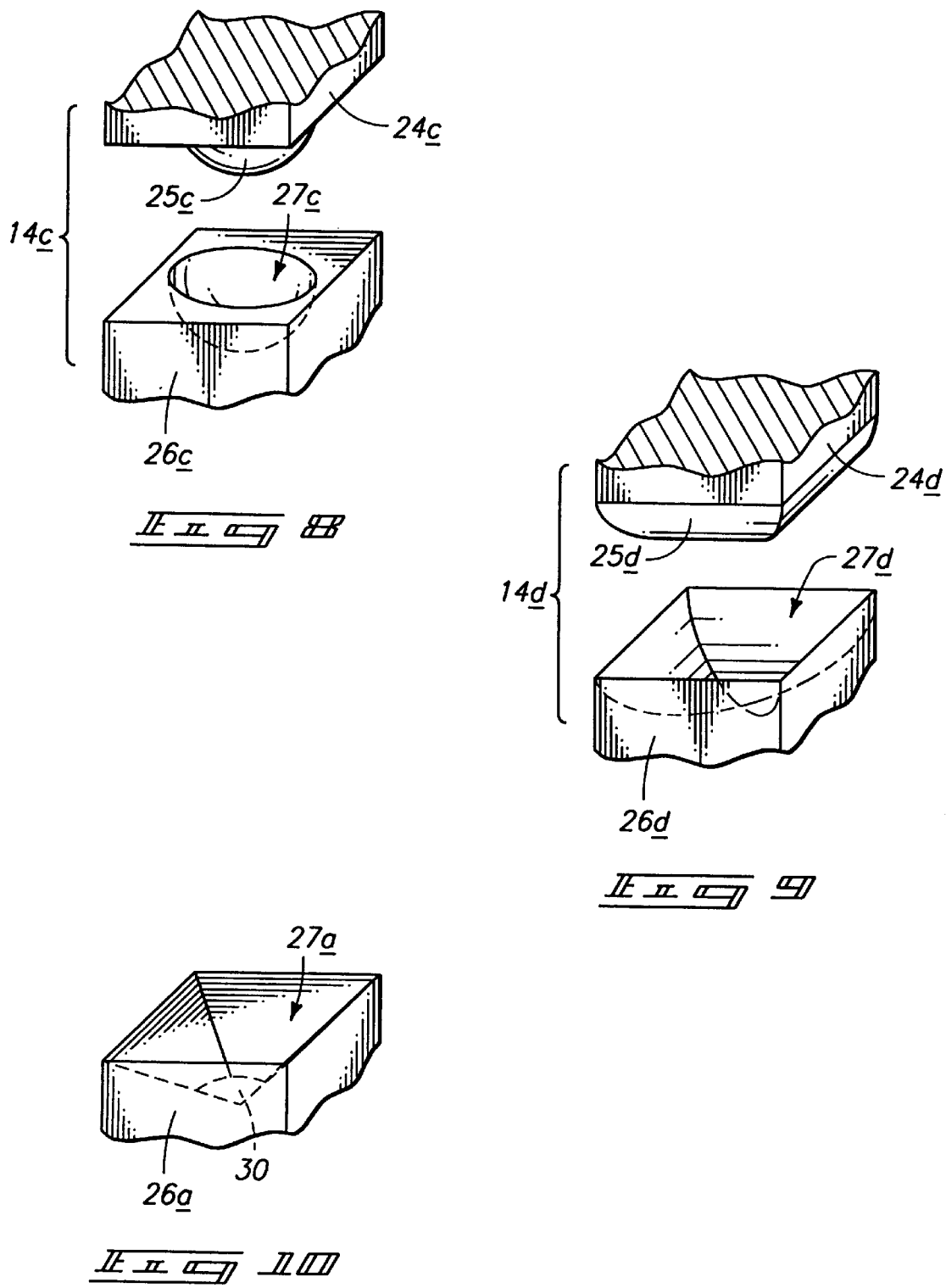

ELECTRICAL INTERCONNECTIONS

RELATED PATENT DATA

This patent resulted from a divisional application of U.S. patent application Ser. No. 09/032,437, filed Feb. 27, 1998, entitled "Electrical Interconnections, Methods of Conducting Electricity, and Methods of Reducing Horizontal Conductivity Within an Anisotropic Conductive Adhesive", naming Tongbi Jiang as inventor, the disclosure of which is incorporated by reference.

TECHNICAL FIELD

The present invention relates to electrical interconnections, methods of conducting electricity, and methods of reducing horizontal conductivity within an anisotropic conductive adhesive.

BACKGROUND OF THE INVENTION

Integrated circuitry is utilized in an ever-increasing number of applications. To meet the needs of the expanding applications, new methods of packaging integrated circuits and connecting integrated circuits with other substrates or circuitry have been developed. Various factors must be considered when connecting integrated circuitry with an adjoining substrate or circuit. Such factors include reliability, performance or speed, and size requirements to meet the requirements of higher definition sub-micron integrated circuits.

Conventional circuit interconnections include flip chip bonding, tape automated bonding (TAB) and conventional wire bonding. Flip chip bonding is preferred in rapid communication or high performance applications because shorter signal paths are provided. The pads are provided upon one surface of the flip chip and the pads can be aligned with conductive pads on an opposing substrate for interconnection. Solder or some type of adhesive is typically used to couple the flip chip with the substrate.

Anisotropic conductive adhesives (ACA) including anisotropic conductive film (ACF) and anisotropic conductive paste (ACP) are used for fine pitch interconnections. These interconnections are utilized in exemplary applications including liquid crystal display (LCD) panels, tape carrier packages (TCP), printed circuit board (PCB) interconnections, indium tin oxide (ITO) connections, and flexible circuit substrate connections.

Such anisotropic conductive adhesives typically comprise an adhesive matrix and plural conductive particles within the adhesive matrix. The conductivity of the anisotropic conductive adhesive is determined by the weight percentage of the conductive fillers or number of conductive particles per unit area. The conductive particles are randomly distributed throughout the adhesive matrix in conventional anisotropic conductive adhesives.

Referring to FIG. 1, plural substrates 1, 2 are shown having respective opposing bond pads 3, 4. An anisotropic conductive adhesive 5 is applied intermediate substrates 1, 2. Anisotropic conductive adhesive 5 includes plural conductive particles 6. One conductive particle 6 intermediate bond pads 3, 4 provides electrical coupling of bond pads 3, 4.

Benefits of anisotropic conductive adhesives include the ability to provide electrical conduction in a z-axis or a vertical direction (i.e., intermediate bond pads 3, 4) while providing substantial electrical insulation in horizontal directions (i.e., insulate adjacent bond pads of the substrate).

High definition technologies require additional conductive particles (i.e., higher density of anisotropic conductive adhesives) to properly electrically connect all interconnections and bond pads of the devices being connected. Current density passing through the interconnection can be defined by the loading or density of particles in a given volume of the adhesive film and by the surface area of the interface coupling the contacts. Increasing the number of conductive particles results in increased current density.

However, increasing the number of conductive particles within the adhesive films also enhances the chances that the anisotropic conductive adhesive will be conductive in at least one horizontal direction. Such horizontal conduction can lead to short circuits and improper circuit performance.

Therefore, there exists a need to provide interconnections for fine pitch or high definition components without the drawbacks associated with the prior art devices and methodologies.

SUMMARY OF THE INVENTION

The present invention includes electrical interconnections, methods of conducting electricity and methods of reducing horizontal conductivity within an anisotropic conductive adhesive.

According to one embodiment, an electrical interconnection is configured to electrically couple a first substrate and a second substrate. The electrical interconnection includes plural electrical contacts. The contacts comprise bond pads of the respective substrates in one embodiment.

An electrical contact of the first substrate has a male configuration and an electrical contact of the second substrate has a female configuration in a preferred embodiment. The electrical contacts of the first and second substrates are configured to mate or couple to form an electrical interconnection. In one embodiment, the male configuration is convex and the female configuration is concave. At least a portion of the male configuration is preferably received within the female configuration during mating.

Other mating configurations can be utilized to form the electrical interconnection. The mating configurations are used to align or guide the substrates during coupling of the substrates in one embodiment.

In some embodiments, an adhesive is provided intermediate the electrical contacts of the electrical interconnection. One exemplary adhesive includes plural conductive particles for providing electrical coupling intermediate the electrical contacts. Such an adhesive comprises an anisotropic conductive adhesive configured to conduct electricity in a vertical direction. Anisotropic conductive adhesives are also configured to provide substantial electrical isolation in horizontal directions. The adhesive can be provided intermediate both substrates during coupling of the substrates.

The electrical contacts of one disclosed electrical interconnection are coupled at an interface. The electrical contacts are preferably configured to provide increased surface area at the interface. The surface area of the interface is ideally greater than a planar dimension defined by the electrical contacts.

Such an interface of increased surface area permits coupling of electrical contacts via an increased number of conductive particles within the adhesive. This configuration reduces resistance within the electrical interconnect. In addition, an anisotropic conductive adhesive having reduced conductive particle loading can be utilized in such configurations while maintaining a substantially similar vertical conductivity intermediate the electrical contacts. Anisotropic conductive adhesives having reduced conductive particle loading provide reduced horizontal electrical conduction and increased insulation of adjacent electrical interconnects.

BRIEF DESCRIPTION OF THE DRAWINGS

Preferred embodiments of the invention are described below with reference to the following accompanying drawings.

FIG. 8 is an isometric view of an electrical interconnection comprising mating dimple-shaped electrical contacts.

FIG. 9 is an isometric view of an electrical interconnection comprising mating pointed male and female electrical contacts.

FIG. 10 is an isometric view illustrating a drop of an anisotropic conductive adhesive provided within a female configuration of an electrical contact.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
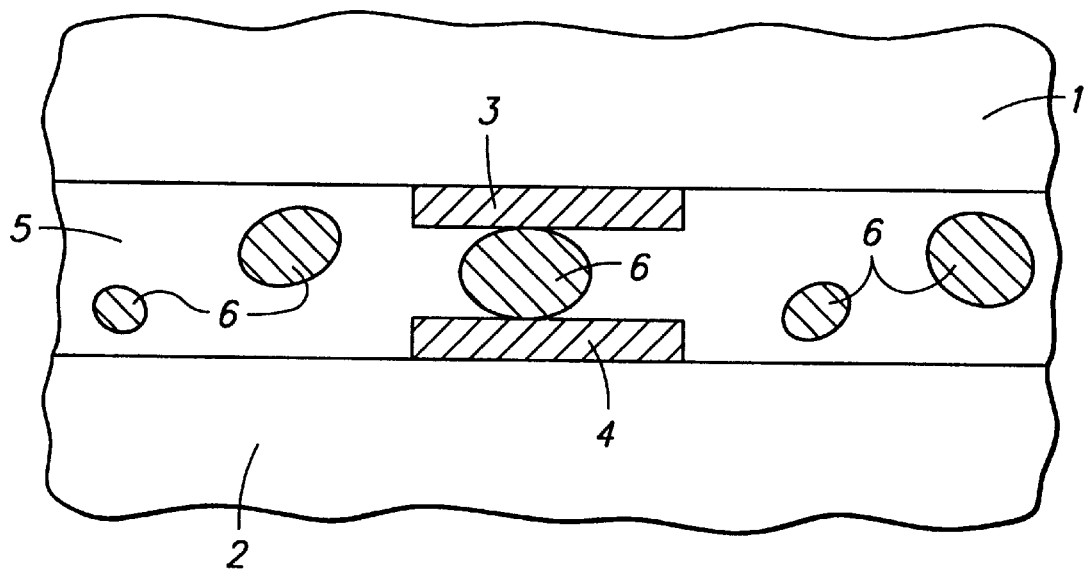
FIG. 1 is a cross-sectional view of a conventional anisotropic conductive adhesive provided intermediate two substrates.
Figure 2:
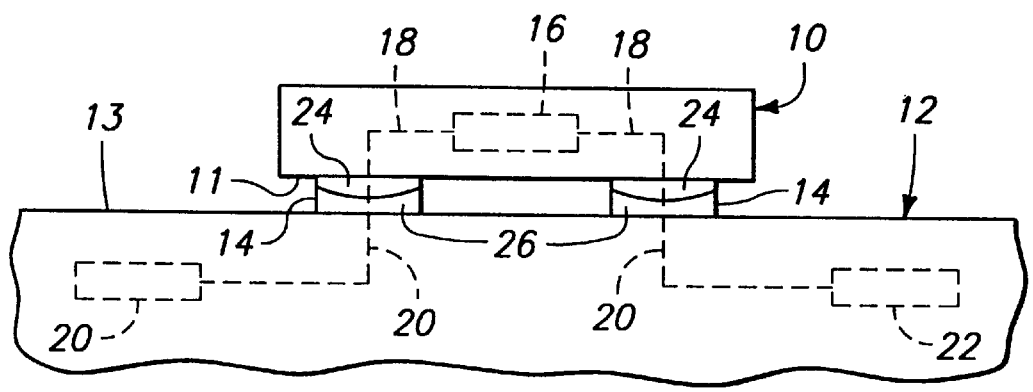
FIG. 2 is a cross-sectional view of a flip chip electrically coupled with a substrate.

Referring to FIG. 2, plural substrates 10, 12 are shown electrically coupled via plural electrical interconnections 14. Substrates 10, 12 include respective opposing surfaces 11, 13. In the described embodiment, substrate 10 comprises a flip chip and substrate 12 comprises a printed circuit board. Substrates 10, 12 comprise different devices in other embodiments. For example, substrates 10, 12 both comprise integrated circuits or flip chips, flexible electrical substrates, etc.

Flip chip 10 includes internal circuitry 16 and internal conductors 18 in the illustrated embodiment. Internal circuitry 16 is electrically coupled with electrical interconnections 14 via internal conductors 18.

Substrate 12 includes internal electrical connections 20 and electronic devices 22. Electrical connections 20 are coupled with electrical interconnections 14. Internal electronic devices 22 are coupled with internal electrical connections 20. Electrical interconnections 14 electrically couple substrate 10 and electrical internal circuitry 16 with substrate 12 and respective electronic devices 22.

Electrical interconnections 14 individually comprise plural electrical contacts 24, 26. Electrical contacts 24, 26 comprise bond pads in the illustrated embodiment. Other configurations of electrical contacts 24, 26 are possible. Electrical contacts 24 of substrate 10 are positioned to correspond to electrical contacts 26 of substrate 12. Electrical contacts 24, 26 of substrates 10, 12 are configured to form plural mated pairs. Electrical contacts 24 are formed upon surface 11 of substrate 10. Electrical contacts 26 are formed upon surface 13 of substrate 12.

Figure 3:
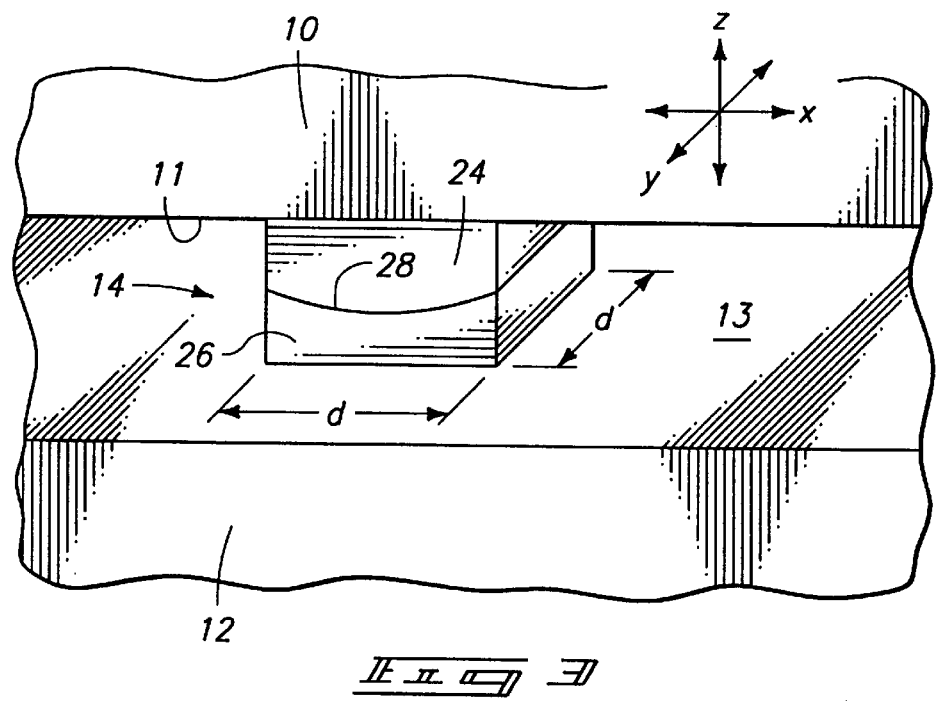
FIG. 3 is an isometric view showing details of an interconnection of the flip chip and substrate shown in FIG. 2.

Referring to FIG. 3, electrical interconnections 14 are described in detail. As described above, individual electrical interconnections 14 comprise mated pairs of electrical contacts 24, 26 of respective substrates 10, 12. In one embodiment, electrical contact 24 of electrical interconnection 14 has a male configuration 25 (shown in FIG. 5). Electrical contact 26 of electrical interconnection 14 has a female configuration 27 (shown in FIG. 5) configured to mate will) male configuration 25 of electrical contact 24. Alternatively, electrical contacts 24, 26 can be configured to include a female configuration and a male configuration, respectively.

In the illustrated embodiment, electrical contact 24 has a substantially convex male configuration 25 and female electrical contact 26 has a complementary substantially concave female configuration 27. In particular, the mated pair of electrical contacts 24, 26 shown in FIG. 3 includes convex and concave bond pads having matching radii of curvatures. At least a portion of male electrical contact 24 is received within female electrical contact 26 during mating or coupling of contacts 24, 26 to form electrical interconnection 14.

Electrical contacts 24, 26 of other shapes may be provided as illustrated below. Electrical contacts 24, 26 can be formed by known methods in the art such as coating and micromachining.

Figure 4:
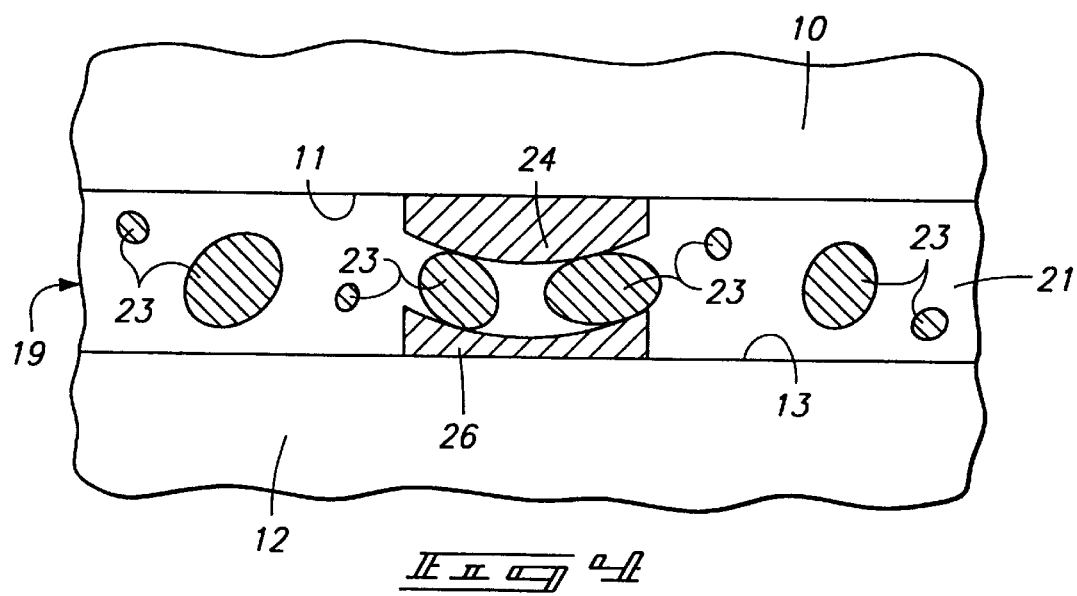
FIG. 4 is a cross-sectional view of an anisotropic conductive adhesive provided intermediate plural substrates.

Referring to FIG. 4, a layer 19 of conductive adhesive is preferably provided intermediate mating electrical contacts 24, 26. Adhesive layer 19 can extend intermediate substrates 10, 12 in addition to electrical contacts 24, 26 in some embodiments and as shown in FIG. 4.

Adhesive layer 19 comprises an anisotropic conductive adhesive in one embodiment. The anisotropic conductive adhesive includes a film 21 and plural conductive particles 23 within film 21. The anisotropic conductive adhesive is configured to provide vertical conduction (conducts in the z-axis direction of FIG. 3) intermediate electrical contacts 24, 26 using conductive particles 23.

Exemplary anisotropic conductive adhesives have part designations XAP15, XAP17, and XAP24 and are available from Toshiba Corporation. Conductive particles 23 of the exemplary anisotropic conductive adhesives comprise gold coated polymer spheres or nickel spheres individually having a radius of three microns or five microns. For an adhesive layer 19 of sixteen microns thick, the Toshiba anisotropic conductive adhesives provide respective densities of 10,000 five micron particles 23 per square millimeter or 40,000 three micron particles 23 per square millimeter.

Ideally, anisotropic conductive adhesives provide minimal horizontal conduction (i.e., conduction in the x-y plane of FIG. 3). Horizontal conduction can result in short circuits of adjacent electrical interconnections and improper electrical performance of electrical circuitry 16, 22 within substrates 10, 12. Shorting of electrical interconnections can also damage electrical circuitry 16, 22.

One method of minimizing horizontal conductivity includes utilizing anisotropic conductive adhesives which have reduced conductive particle loading. Utilization of anisotropic conductive adhesives having reduced particle loading provides less chance of conducting in x-y plane.

Horizontal conduction can also be reduced according to the following. Electrical contacts 24, 26 of interconnection 14 are joined at an interface 28. Conductivity at interface 28 through anisotropic conductive adhesive 19 is determined by the surface area of interface 28 times the density (conductive particles per unit area) of the anisotropic conductive adhesive. Increasing the surface area of interface 28 results in an increase in the conductivity for a given unit of volume of anisotropic conductive adhesive 19 intermediate electrical contacts 24, 26. An interface 28 having an increased surface area requires an anisotropic conductive adhesive having fewer conductive particles to provide a substantially similar conductivity of an adhesive having more conductive particles (an example is described below with reference to FIG. 7). Such conductivity is provided because more conductive particles 23 contact the increased surface area of electrical contacts 24, 26 at interface 28 compared with conventional connections.

Referring again to FIG. 3, electrical contacts 24, 26 configured to form interface 28 having an increased surface area are described. Individual electrical contacts 24, 26 define a planar dimension substantially perpendicular to the flow of electricity or current through electrical interconnection 14. The respective planar dimensions can be defined at the interfaces of contacts 24, 26 with respective surfaces 11, 13 of substrates 10, 12. As illustrated in FIG. 3, the respective planar dimensions of electrical contacts 24, 26 comprise squares having individual sides of a length. The defined planar dimensions individually have an area.

With the use of anisotropic conductive adhesives and in accordance with the present invention, it is preferred to provide the surface area at interface 28 greater than the surface area of the defined planar dimensions to improve the conductivity intermediate contacts 24, 26 at electrical interface 28. Electrical contacts 24, 26 having mating configurations 25, 27 according to the present invention are configured to provide an increased active surface area at interface 28 for interconnection of opposing electrical contacts 24, 26.

The joining of electrical contacts 24, 26 at interface 28 having an increased surface area enhances vertical (z-axis) conduction. In particular, such enhances the chances electrical contacts 24, 26 will be electrically coupled. Further, a more efficient z-axis contact is provided intermediate electrical contacts 24, 26, resistance within electrical interconnection 14 is reduced, and the chances of electrical bridging in the x-y plane is reduced.

Utilizing electrical contacts 24, 26 of the present invention provides increased surface area at interface 28 which enables utilization of an anisotropic conductive adhesive 19 having reduced loading of conductive particles 23 to provide substantially similar conductivity as that of an anisotropic conductive adhesive having greater conductive particle loading. Thus, the present invention provides substantially undiminished vertical conductivity through anisotropic conductive adhesive layer 19 intermediate electrical contacts 24, 26, while providing reduced conductivity in the x-y plane with the use of an anisotropic conductive adhesive layer 19 having reduced conductive particle loading.

Electrical contacts 24, 26 according to the present invention are configured to provide vertical conductivity via an increased number of conductive particles 23 for a given volume of adhesive 21 and an adhesive 21 having a certain loading or density of conductive particles 23. The corresponding increased number of conductive particles within the anisotropic conductive adhesive which provide vertical conductivity provides the reduced resistance intermediate electrical contacts 24, 26.

In sum, utilizing electrical contacts 24, 26 configured in accordance with the present invention in combination with an anisotropic conductive adhesive of reduced loading provides reduced horizontal conductivity within anisotropic conductive adhesive 21 while maintaining a given vertical conductivity through adhesive 21 intermediate electrical contacts 24, 26.

Referring to FIGS. 5–9, exemplary mating male and female electrical contacts 24, 26 are illustrated. Like reference numerals represent like components herein with any changes therebetween represented by an alphabetical suffix such "as".

Figure 5:
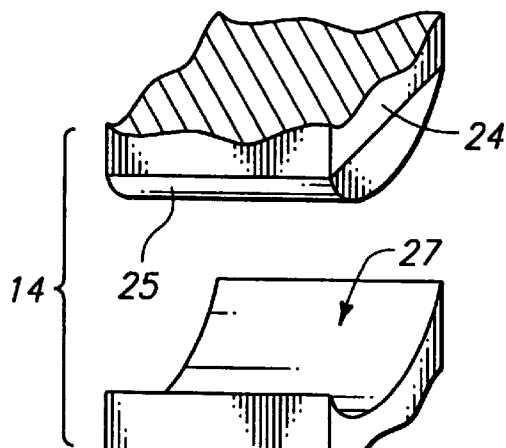
FIG. 5 is an isometric view of an electrical interconnection comprising mating concave and convex electrical contacts.

Referring to FIG. 5, electrical contact 24 includes a convex male configuration 25 and contact 26 includes a concave female configuration 27 in the illustrated pair of mating contacts.

Figure 6:
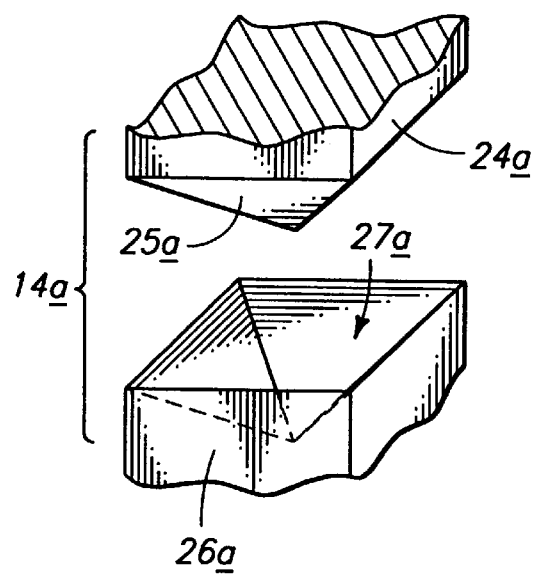
FIG. 6 is an isometric view of an electrical interconnection comprising mating pyramidal-shaped electrical contacts.

Referring to FIG. 6, electrical interconnection 14a is shown. Male configuration 25a of electrical contact 24a and female configuration 27a of electrical contact 26a are mating pyramidal-shapes in the illustrated electrical interconnection 14a.

Figure 7:
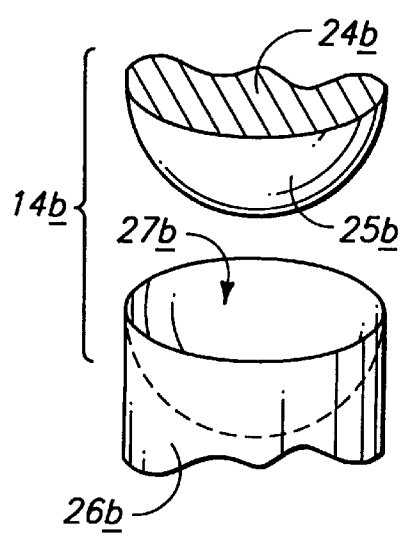
FIG. 7 is an isometric view of an electrical interconnection comprising mating spherical electrical contacts.

Referring to FIG. 7, electrical interconnection 14b is shown. Male configuration 25b of electrical contact 24b and female configuration 27b of electrical contact 26b are mating spherical-shapes in electrical interconnection 14b. Spherical-shaped configurations 25b, 27b provide an active surface area at interface 28 which is twenty-five percent greater than conventional flat electrical connections. In particular, a spherical bond pad with a radius of three thousands of an inch (mils), and a height of 1.5 mils, the changes of surface area is expressed by $$\frac{\Delta S}{S} = \frac{\pi(r^2 + h^2) - \pi r^2}{\pi r^2} = \left(\frac{h^2}{r}\right) = 0.25.$$

Providing an increased surface area at interface 28 of twenty-five percent enables an anisotropic conductive adhesive having a density of 8,000 particles per square millimeter to provide substantially the same conductance as an anisotropic conductive adhesive having 10,000 particles per square millimeter.

In particular, density of conductive particles times surface area provides the conductance. A ratio of surface areas of conventional electrical contacts to the electrical contacts illustrated in FIG. 7 is 0.8 (determined by 1/1.25). Multiplying the original density by the determined ratio yields a reduced density adhesive which provides a substantially similar conductance as that of the original density adhesive when the reduced density adhesive is used with electrical contacts 24, 26 having mating surfaces of the increased surface areas.

As described above, reducing the conductive particle loading of the anisotropic conductive adhesive provides less chance of electrical bridging in the x-y plane while providing substantially the same conductivity in the vertical or z-axis direction intermediate electrical contacts 24, 26.

Referring to FIG. 8, electrical interconnection 14c is shown. Electrical contact 24c includes a dimple-shaped male configuration 25c and electrical contact 26c includes a mating dimple-shaped female configuration 27c in the illustrated electrical interconnection 14c.

Referring to FIG. 9, electrical interconnection 14d is illustrated. Male configuration 25d and female configuration 27d of respective electrical contacts 24d, 26d individually comprise mating members having a pair of opposing surfaces configured to join at a common point. The opposing surfaces of the pairs slope away from one another in a common direction.

Referring to FIG. 10, a glob or drop 30 of an anisotropic conductive adhesive is shown provided or applied within female configuration 27i aof electrical contact 26a. Drop 30 of anisotropic conductive adhesive is preferably provided within female configuration 27a prior to mating of female electrical contact 26a with corresponding male electrical contact 24a. Drop 30 is screen printed into female configuration 27a in one embodiment although other application techniques can be used.

Using this fabrication technique, drop 30 of anisotropic conductive adhesive is maintained within female configuration 27a. This provides proper positioning of the adhesive for electrically coupling electrical contacts 24, 26 when contacts 24, 26 are mated. Gravity tends to retain adhesive drop 30 within female configuration 27a reducing outflowing of overflowing of the adhesive from the electrical interconnection area.

Although the provision of drop 30 in configuration 27a described with reference to electrical contacts 24a, 26a, this processing technique applies to other electrical contact configurations for facilitating coupling and mating of electrical contacts 24, 26. Dots or drops 30 of the anisotropic conductive adhesive or other adhesive can be dispensed or screen printed onto the bottom of any appropriate female configuration 27.

These fabrication techniques also provide improved control in isotropic adhesive applications. In particular, isotropic adhesives can be utilized to couple and adhere mating electrical contacts 24, 26.

Figure 11:
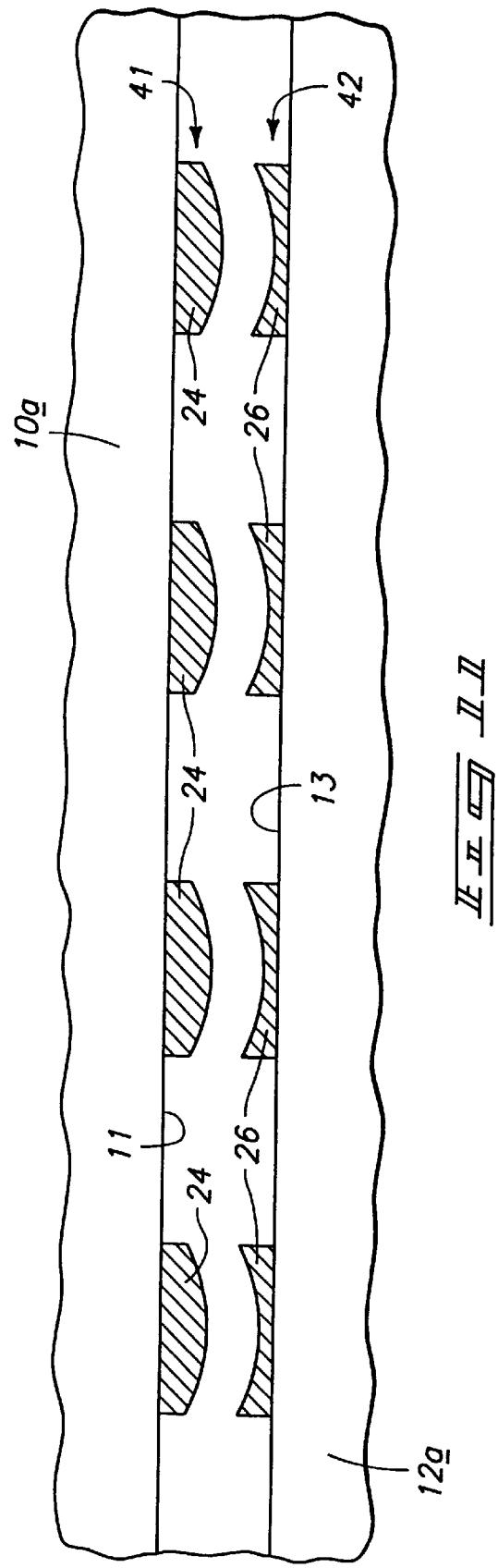
FIG. 11 is a cross-sectional view illustrating plural electrical contacts of a flip chip and plural corresponding electrical contacts of a substrate.

Referring to FIG. 11, substrate 10a includes an array 41 of male electrical contacts 24 formed upon surface 11 of substrate 10a. In addition, substrate 12a includes an array 42 of female electrical contacts 26 formed upon surface 13 of substrate 12a. Electrical contacts 24, 26 are configured upon respective surfaces 11, 13 to form mating pairs of electrical interconnections between substrate 10a and substrate 12a.

Forming electrical contacts 24, 26 having respective mating configurations 25, 27 according to the present invention provides a self-guiding or self-aligning feature which facilitates proper alignment of substrates 10a, 12a and electrical contacts 24, 26 when such substrates are coupled. Mating configurations 25, 27 assist with coupling of substrates 10, 12 by guiding the coupling and aligning of electrical contacts 24, 26.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An electrical interconnection configured to electrically couple a first substrate and a second substrate, the electrical interconnection comprising:
    a bond pad on the first substrate and having a male configuration; and
    a bond pad on the second substrate and having a female configuration and being configured to mate with the bond pad having the male configuration.

2. The electrical interconnection according to claim 1 further comprising an adhesive on the bond pad having the female configuration.

3. The electrical interconnection according to claim 1 further comprising a vertically conductive adhesive intermediate the first substrate and the second substrate.

4. The electrical interconnection according to claim 1 wherein at least one of the first substrate and the second substrate comprises a flip chip.

5. The electrical interconnection according to claim 1 wherein the bond pad having the male configuration includes a convex surface and the bond pad having the female configuration includes a concave surface.

6. The electrical interconnection according to claim 1 wherein the bond pads of the first substrate and second substrate comprise mating pyramidal-shaped surfaces.

7. The electrical interconnection according to claim 1 wherein the bond pads of the first substrate and second substrate comprise mating spherical-shaped surfaces.

8. The electrical interconnection according to claim 1 wherein the bond pads of the first substrate and second substrate comprise mating dimple-shaped surfaces.

9. The electrical interconnection according to claim 1 wherein the bond pads of the first substrate and second substrate comprise mating surfaces individually having pairs of opposing surfaces which join at a common point and opposing surfaces of the pairs slope away from one another in a common direction.

10. An electrical interconnection configured to electrically couple a first substrate and a second substrate, the electrical interconnection comprising mating bond pads individually defining a planar dimension and the mating bonds pads being joined at an interface having a surface area greater than the area of the planar dimension.

11. The electrical interconnection according to claim 10 wherein the planar dimensions are the areas of the interfaces of individual bond pads and the respective substrates.

12. The electrical interconnection according to claim 10 further comprising an adhesive intermediate the mating bond pads.

13. The electrical interconnection according to claim 10 further comprising a vertically conductive adhesive intermediate the first substrate and the second substrate.

14. The electrical interconnection according to claim 10 wherein the mating bond pads comprise one of a male configuration and a female configuration.

15. The electrical interconnection according to claim 14 wherein the bond pad having the male configuration includes a convex surface and the bond pad having the female configuration includes a concave surface.

16. An electrical interconnection configured to electrically couple a first substrate and a second substrate, the electrical interconnection comprising:
    a first electrical contact having a male configuration;
    a second electrical contact having a female configuration; and
    an anisotropic conductive adhesive intermediate the first electrical contact and the second electrical contact.

17. The electrical interconnection according to claim 16 wherein the adhesive comprises a film including a plurality of conductive particles and the first and second electrical contacts are configured to provide conductivity via an increased number of conductive particles.

18. The electrical interconnection according to claim 16 wherein the first electrical contact is convex and the second electrical contact is concave.

19. The electrical interconnection according to claim 16 wherein the electrical contacts comprise bond pads.

20. An electrical interconnection configured to electrically couple a first substrate and a second substrate, the electrical interconnection comprising:
   a first electrical contact of a first substrate;
   a second electrical contact of a second substrate configured to mate with the first electrical contact at an interface, the first and second electrical contacts individually defining a planar dimension and the surface area of the interface being greater than the area of the planar dimension; and
   an anisotropic conductive adhesive intermediate the first electrical contact and the second electrical contact.

21. The electrical interconnection according to claim 20 wherein the planar dimensions are the areas of the interfaces of individual electrical contacts and the respective substrates.

22. The electrical interconnection according to claim 20 wherein the adhesive comprises a film including a plurality of conductive particles and the mated electrical contacts are configured to provide conductivity via an increased number of conductive particles for a given volume of adhesive.

23. The electrical interconnection according to claim 20 wherein the first electrical contact is convex and the second electrical contact is concave.

24. The electrical interconnection according to claim 20 wherein the electrical contacts comprise bond pads.

25. The electrical interconnection according to claim 20 wherein the first and second electrical contacts individually comprise one of a male configuration and a female configuration.

26. An electrical circuit comprising:
   a flip chip including:
      a surface;
      a circuit; and
      a plurality of bond pads provided upon the surface of the flip chip and electrically connected with the circuit, the bond pads of the flip chip individually having one of a male configuration and a female configuration;
   a substrate including:
      a surface;
      a plurality of electrical connections; and
      a plurality of bond pads provided upon the surface of the substrate, the bond pads of the substrate being electrically connected with the electrical connections and positioned to correspond to the bond pads of the flip chip, the bond pads of the substrate individually having one of a male configuration and a female configuration, the bond pads of the substrate being configured to form plural mated pairs with the bond pads of the flip chip; and
   an adhesive intermediate and the surface of the flip chip and the surface of the substrate and intermediate mated pairs of bond pads of the flip chip and the substrate, the adhesive comprises an anisotropic conductive adhesive configured to electrically couple the pairs of mated bond pads of the flip chip and the substrate in a substantially vertical direction.

* * * * *

UNITED STATES PATENT AND TRADEMARK OFFICE
CERTIFICATE OF CORRECTION

PATENT NO : 6,137,063
DATED : October 24, 2000
INVENTOR(S) : Tongbi Jiang

It is certified that error appears in the above-identified patent and that said Letters Patent are hereby corrected as shown below:

Col. 4, Line 18, Replace "will)" with --with--.

Col. 5, Line 31, Please insert --"d"-- after "length".

Col. 6, Line 17, Please delete ""as"" and insert --as "a"--.

Col. 7, Line 10, Replace "27i aof" with --27a of--.

Signed and Sealed this

Fifteenth Day of May, 2001

*Attest:*

NICHOLAS P. GODICI

*Attesting Officer*  Acting Director of the United States Patent and Trademark Office